United States Patent
Nakai et al.

(10) Patent No.: US 8,422,207 B2
(45) Date of Patent: Apr. 16, 2013

(54) AL ALLOY FILM FOR DISPLAY DEVICE, DISPLAY DEVICE, AND SPUTTERING TARGET

(75) Inventors: Junichi Nakai, Kobe (JP); Akira Nanbu, Kobe (JP); Hiroshi Goto, Kobe (JP); Hiroyuki Okuno, Kobe (JP); Aya Miki, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 236 days.

(21) Appl. No.: 12/922,965

(22) PCT Filed: Apr. 23, 2009

(86) PCT No.: PCT/JP2009/058052
§ 371 (c)(1),
(2), (4) Date: Sep. 16, 2010

(87) PCT Pub. No.: WO2009/131169
PCT Pub. Date: Oct. 29, 2009

(65) Prior Publication Data
US 2011/0019350 A1 Jan. 27, 2011

(30) Foreign Application Priority Data
Apr. 23, 2008 (JP) ................. 2008-112912

(51) Int. Cl.
*G06F 1/16* (2006.01)
(52) U.S. Cl.
USPC ....... 361/679.01; 257/765; 313/495; 345/214
(58) Field of Classification Search ........... 257/66, 257/291, 292, 145, 765, 750, 771; 445/24, 445/57; 438/194, 166, 688, 30; 313/503, 313/506, 496; 361/679.01, 679.21, 679.27, 361/679.22, 679.23, 679.24, 679.25, 679.26, 361/679.31, 679.32, 679.33, 679.41; 165/104.33, 165/56, 80.2; 345/173, 174, 211, 690, 92, 345/214; 204/192.1, 298.01; 174/126.1, 174/126.2
See application file for complete search history.

(56) References Cited

U.S. PATENT DOCUMENTS

| 5,514,909 A | 5/1996 | Yamamoto et al. |
| 6,033,542 A | 3/2000 | Yamamoto et al. |

(Continued)

FOREIGN PATENT DOCUMENTS

| JP | 11 283934 | 10/1999 |
| JP | 11 284195 | 10/1999 |

(Continued)

OTHER PUBLICATIONS

U.S. Appl. No. 13/122,937, filed Apr. 6, 2011, Nanbu, et al.

(Continued)

*Primary Examiner* — Hung Duong
(74) *Attorney, Agent, or Firm* — Oblon, Spivak, McClelland, Maier & Neustadt, L.L.P.

(57) ABSTRACT

Disclosed is an Al alloy film for a display device that, even when low-temperature heat treatment is applied, can realize satisfactorily low electric resistance, can realize a satisfactory reduction in contact resistance between the Al alloy film and a transparent pixel electrode connected directly to the Al alloy film, and has excellent corrosion resistance. The Al alloy film is connected directly to a transparent electroconductive film on the substrate in the display device. The Al alloy film comprises 0.05 to 0.5 atomic % of Co and 0.2 to 1.0 atomic % of Ge and satisfies the requirement that the content of Co and the content of Ge in the Al alloy film have a relationship represented by formula (1): $[Ge] \geq -0.25 \times [Co] + 0.2$ (1) In formula (1), [Ge] represents the content of Ge in the Al alloy film, atomic %; and [Co] represents the content of Co in the Al alloy film, atomic %.

16 Claims, 8 Drawing Sheets

U.S. PATENT DOCUMENTS

| | | | |
|---|---|---|---|
| 6,096,438 | A | 8/2000 | Takagi et al. |
| 6,218,206 | B1 | 4/2001 | Inoue et al. |
| 6,252,247 | B1 | 6/2001 | Sakata et al. |
| 7,098,539 | B2 | 8/2006 | Gotoh et al. |
| 7,154,180 | B2 | 12/2006 | Gotoh et al. |
| 7,262,085 | B2 | 8/2007 | Gotoh et al. |
| 7,365,810 | B2 | 4/2008 | Gotoh et al. |
| 7,411,298 | B2 | 8/2008 | Kawakami et al. |
| 7,553,754 | B2 | 6/2009 | Gotoh et al. |
| 7,622,809 | B2 | 11/2009 | Gotoh et al. |
| 7,683,370 | B2 | 3/2010 | Kugimiya et al. |
| 7,781,767 | B2 | 8/2010 | Kawakami et al. |
| 7,952,123 | B2 * | 5/2011 | Gotoh et al. .................. 257/291 |
| 2003/0047812 | A1 | 3/2003 | Hagihara et al. |
| 2004/0126608 | A1 | 7/2004 | Gotoh et al. |
| 2005/0118811 | A1 | 6/2005 | Murata |
| 2006/0091792 | A1 | 5/2006 | Kugimiya et al. |
| 2006/0180250 | A1 | 8/2006 | Kugimiya et al. |
| 2006/0181198 | A1 | 8/2006 | Gotoh et al. |
| 2006/0275618 | A1 | 12/2006 | Kugimiya et al. |
| 2008/0048189 | A1 * | 2/2008 | Yamazaki et al. ............. 257/66 |
| 2008/0081532 | A1 * | 4/2008 | Okuno ............................ 445/24 |
| 2008/0121522 | A1 | 5/2008 | Ehira et al. |
| 2008/0223718 | A1 | 9/2008 | Takagi et al. |
| 2008/0315203 | A1 | 12/2008 | Hino et al. |
| 2009/0001373 | A1 | 1/2009 | Ochi et al. |
| 2009/0004490 | A1 | 1/2009 | Gotou et al. |
| 2009/0011261 | A1 | 1/2009 | Gotou |
| 2009/0026072 | A1 | 1/2009 | Takagi et al. |
| 2009/0133784 | A1 | 5/2009 | Kugimiya et al. |
| 2009/0176113 | A1 | 7/2009 | Gotoh et al. |
| 2009/0242394 | A1 | 10/2009 | Takagi et al. |
| 2010/0012935 | A1 | 1/2010 | Hino et al. |
| 2010/0032186 | A1 | 2/2010 | Gotou et al. |
| 2010/0065847 | A1 | 3/2010 | Gotou et al. |
| 2010/0163877 | A1 | 7/2010 | Hino et al. |
| 2010/0207121 | A1 | 8/2010 | Hino et al. |

FOREIGN PATENT DOCUMENTS

| | | |
|---|---|---|
| JP | 11 337976 | 12/1999 |
| JP | 2003 273109 | 9/2003 |
| JP | 2004 214606 | 7/2004 |
| JP | 2005 171378 | 6/2005 |
| JP | 2006 261636 | 9/2006 |
| JP | 2007 157917 | 6/2007 |
| JP | 4117001 | 4/2008 |
| KR | 10-1998-0051666 | 9/1998 |
| KR | 10-2006-0092145 | 8/2006 |
| WO | 2008 032786 | 3/2008 |
| WO | WO 2008/032786 A1 | 3/2008 |

OTHER PUBLICATIONS

U.S. Appl. No. 13/126,126, filed Apr. 26, 2011, Ochi, et al.
Korean Notice of Preliminary Rejection issued Feb. 24, 2012, in Korea Patent Application No. 10-2010-7023592 (with English Translation).
U.S. Appl. No. 13/387,522, filed Jan. 27, 2012, Goto, et al.
U.S. Appl. No. 13/387,557, filed Jan. 27, 2012, Maeda, et al.
U.S. Appl. No. 12/999,034, filed Dec. 14, 2010, Kawakami, et al.
U.S. Appl. No. 13/056,444, Jan. 28, 2011, Onishi, et al.
U.S. Appl. No. 13/320,673, filed Nov. 15, 2011, Tanifuji, et al.
U.S. Appl. No. 13/144,716, filed Jul. 15, 2011, Goto, et al.
U.S. Appl. No. 13/254,316, filed Sep. 1, 2011, Kobayashi, et al.
U.S. Appl. No. 13/581,436, filed Aug. 27, 2012, Iwasaki, et al.

* cited by examiner

TEG PATTERN

AL ALLOY FILM FOR DISPLAY DEVICE, DISPLAY DEVICE, AND SPUTTERING TARGET

TECHNICAL FIELD

The present invention relates to an Al alloy film for display device, a display device, and a sputtering target.

BACKGROUND ART

Liquid crystal display devices used in a variety of fields from small-sized devices such as mobile phones to large-sized devices such as TV sets of 30 inches or larger are each comprised of a thin-film transistor (which will hereinafter be called "TFT") as a switching device, a transparent pixel electrode, a wiring portion such as gate wiring and source-drain wiring, a TFT substrate equipped with a semiconductor layer such as amorphous silicon (a-Si) or polycrystalline silicon (p-Si), a counter substrate placed to face with the TFT substrate with a predetermined space and equipped with a common electrode, and a liquid crystal layer filled between the TFT substrate and the counter substrate.

In the TFT substrate, Al alloys such as pure Al and Al—Nd (which alloys may hereinafter be called "Al-based alloys", collectively) have been used widely as a material for gate wiring or source-drain wiring because they have a low electrical resistance and can be easily microfabricated. It is the common practice to place a barrier metal layer made of a refractory metal such as Mo, Cr, Ti, or W between the Al-based alloy wiring and a transparent pixel electrode. The Al-based alloy wirings are thus connected to each other via a barrier metal layer because direct connection between the Al-based alloy wiring and the transparent pixel electrode may raise a contact resistance and deteriorate the visual quality of the display. Described specifically, Al constituting a wiring directly connected to the transparent pixel electrode is considerably susceptible to oxidation. Due to oxygen generated during the film formation procedures of a liquid crystal display or oxygen added upon film formation, an insulating layer of an Al oxide may inevitably be formed on the interface between the Al-based alloy wiring and the transparent pixel electrode. In addition, a transparent conductive film such as ITO constituting the transparent pixel electrode is made of a conductive metal oxide but the Al oxide layer formed as described above prevents an electrical ohmic contact.

Formation of a barrier metal layer, however, requires, in addition to a sputtering apparatus necessary for the formation of a gate electrode, a source electrode, and further a drain electrode, a deposition chamber of a barrier metal. As the cost of liquid crystal displays is decreasing through mass production, it has been impossible to neglect an increase in the production cost and a reduction in productivity attributable to the formation of a barrier metal layer.

There are therefore proposed an electrode material or a manufacturing method that can omit the formation of a barrier meal layer and thereby enables direct connection of an Al-based alloy interconnect to a transparent pixel electrode.

For example, the present applicants disclose a direct contact technique capable of omitting a barrier metal layer and at the same time, directly and reliably connecting an Al-based alloy interconnect to a transparent pixel electrode without increasing the number of steps (Patent Document 1).

More specifically, Patent Document 1 discloses an Al alloy containing, as an alloy component, at least one element selected from the group consisting of Au, Ag, Zn, Cu, Ni, Sr, Ge, Sm, and Bi in an amount of 0.1 to 6 atomic percent. When an Al-based alloy wiring made of the above Al alloy is used, it becomes possible to reduce a contact resistance with a transparent pixel electrode even if a barrier metal layer is omitted, by causing at least a portion of these alloy components to exist as a precipitate or concentrated layer on the interface between the Al alloy film and the transparent pixel electrode.

The Al alloys containing Ni or the like which are described in Patent Document 1 each have a heat-resistant temperature of approximately from 150 to 200° C. and is lower than the maximum temperature in the manufacturing steps of a display device (particularly, a TFT substrate).

The manufacturing temperature of a display device tends to decrease in recent years from the standpoint of improving the yield and productivity. Even if the maximum temperature (deposition temperature of a silicon nitride film) in the manufacturing steps is reduced to 300° C., it exceeds the heat resistant temperature of the Al alloy described in Patent Document 1.

On the other hand, a reduction in the maximum temperature (which will be called "heat treatment temperature" in the present invention) in the manufacturing steps may cause a trouble that the electrical resistance of an Al-based alloy wiring does not decrease adequately. The present applicants therefore disclose, in Patent Document 2, an Al alloy showing an adequately low electrical resistance even at a low heat treatment temperature while showing a good heat resistance.

Described specifically, the present applicants disclose an Al alloy film made of an Al-α-X alloy containing at least one element (which will hereinafter be called "α component") selected from the group consisting of Ni, Ag, Zn, Cu, and Ge and at least one element (which will hereinafter be called "X component) selected from the group consisting of Mg, Cr, Mn, Ru, Rh, Pd, Ir, Pt, La, Ce, Pr, Gd, Tb, Sm, Eu, Ho, Er, Tm, Yb, Lu, and Dy.

According to this document, when the above Al alloy film is used for a thin-film transistor substrate, a barrier metal layer can be omitted and at the same time, the Al alloy film can be directly and reliably brought into contact with a transparent pixel electrode made of an Al alloy film and a conductive oxide film without increasing the number of the steps. In addition, even when a heat treatment temperature as low as about 100° C. or more but not more than 300° C. is applied to the Al alloy film, both a reduction in electrical resistance and excellent heat resistance can be achieved. More specifically, it is described that even if heat treatment is conducted, for example, at as low as 250° C. for 30 minutes, the Al alloy film can achieve an electrical resistivity of 7 μΩ·cm or less without causing defects such as hillocks.

PRIOR ART DOCUMENT

Patent Document

[Patent Document 1] Japanese Patent Laid-Open No. 2004-214606
[Patent Document 2] Japanese Patent Laid-Open No. 2006-261636

SUMMARY OF THE INVENTION

Problems that the Invention is to Solve

As described above, when an alloy element is added to pure Al, various functions, which cannot be observed from pure Al, are imparted to pure Al. An increase in the amount of the alloy element, on the other hand, inevitably increases the electrical resistance of a wiring itself. Further, addition of an alloy element deteriorates corrosion resistance, which is an undesirable tendency.

The manufacturing steps of an array substrate include a plurality of wet processes. Addition of a metal nobler than Al causes a problem of galvanic corrosion and deteriorates the corrosion resistance. For example, in a photolithography step, an alkaline developer containing TMAH (tetramethylammonium hydroxide) is used. In a direct contact structure in which a barrier metal layer is omitted, the Al alloy film is exposed and is susceptible to damage with the developer.

In a washing step for peeling off a photoresist (resin) formed in the photolithography step, continuous washing is conducted with water and an organic remover containing an amine. However, when the amine and water are mixed, the resulting mixture, which is an alkaline solution, causes another problem, that is, corrosion of Al in short hours. The Al alloy has already been subjected to thermal history in a CVD step conducted prior to the washing and peeling step. During this thermal history, the alloy component forms a precipitate in the Al matrix. Since there is a large potential difference between the precipitate and Al, as soon as the amine of the remover is brought into contact with water, alkali corrosion proceeds due to the galvanic corrosion, and ionization and elution of Al, which is electrochemically a base metal, occur, resulting in pitting corrosion (black spot).

With the foregoing in view, the present invention has been made. An object of the present invention is to provide an Al alloy film for display device which exhibits an adequately low electrical resistivity even at a low heat treatment temperature, exhibits a low contact resistance even if a barrier metal layer is omitted, and at the same time, shows high resistance against an alkaline developer or remover to be used in the manufacturing procedure of the display device.

Means for Solving the Problems

The following is the gist of the present invention.

[1] An Al alloy film for display device which is to be directly connected to a transparent conductive film on a substrate of the display device, wherein:

the Al alloy film comprises Co in an amount of 0.05 to 0.5 atomic percent and Ge in an amount of 0.2 to 1.0 atomic percent; and the Co content and the Ge content in the Al alloy film satisfy the following formula (1):

$$[Ge] \geq -0.25 \times [Co] + 0.2 \quad (1)$$

(in the formula (1), [Ge] represents the Ge content (atomic percent) in the Al alloy film and [Co] represents the Co content (atomic percent) in the Al alloy film).

[2] The Al alloy film for display device as described in [1], further comprising at least one element selected from the group of rare earth elements in a total content of 0.05 to 0.7 atomic percent (preferably in a total content of 0.05 to 0.3 atomic percent).

[3] The Al alloy film for display device as described in [2], wherein the group of rare earth elements consists of Nd, Gd, La, Y, Ce, Pr, and Dy.

[4] A display device equipped with a thin-film transistor comprising the Al alloy film for display device described in any one of [1] to [3].

[5] A sputtering target comprising Co in an amount of 0.05 to 0.5 atomic percent and Ge in an amount of 0.2 to 1.0 atomic percent, the Co content and the Ge content satisfying the following formula (1):

$$[Ge] \geq -0.25 \times [Co] + 0.2 \quad (1)$$

(in the formula (1), [Ge] represents the Ge content (atomic percent) in the sputtering target and [Co] represents the Co content (atomic percent) in the sputtering target); and further comprising, as a remaining portion, Al and an inevitable impurity.

[6] The sputtering target as described in [5], further comprising at least one element selected from the group of rare earth elements in a total content of 0.05 to 0.7 atomic percent (preferably in a total content of 0.05 to 0.3 atomic percent).

[7] The sputtering target as described in [6], wherein the group of rare earth elements consists of Nd, Gd, La, Y, Ce, Pr, and Dy.

Advantage of the Invention

The present invention makes it possible to provide an Al alloy film for display device capable of being directly connected to a transparent pixel electrode (transparent conductive film, oxide conductive film) without placing a barrier metal layer therebetween, showing a sufficiently low electrical resistivity even when a relatively low heat treatment temperature (for example, 250 to 300° C.) is applied, having excellent corrosion resistance (resistance against alkaline developer, resistance against remover), and capable of ensuring heat resistance. The term "heat treatment temperature" as used herein means a treatment temperature which becomes the highest in the manufacturing steps of the display device (for example, a manufacturing step of a TFT substrate). In the manufacturing steps of a conventional display device, it means a heating temperature of a substrate when CVD is performed for deposition of various thin films or a temperature of a heat treating furnace for thermosetting a protective film.

When the Al alloy film of the present invention is for a display device, the barrier metal layer can be omitted. Accordingly, a highly-productive, low-cost, and high-performance display device can be obtained by using the Al alloy film of the present invention.

MODES FOR CARRYING OUT THE INVENTION

Figure 1:
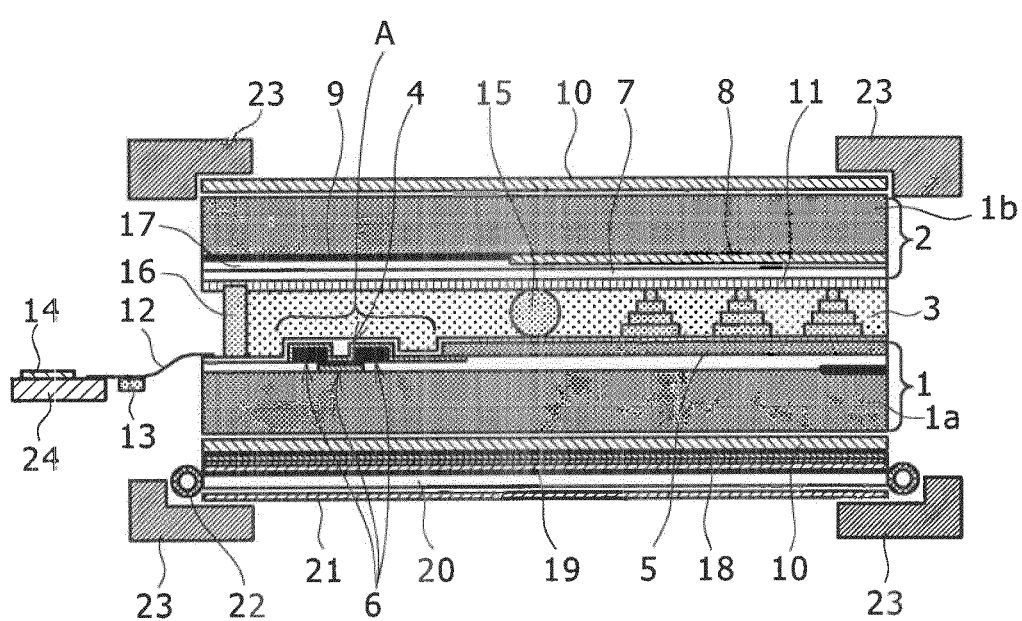
FIG. 1 is an enlarged schematic cross-sectional view illustrating the constitution of a typical liquid-crystal display for which an amorphous silicon TFT substrate is used.

The present inventors have carried out an extensive investigation in order to obtain an Al alloy film capable of sufficiently reducing an electrical resistivity even when the heat treatment temperature is low, capable of having an adequately reduced contact resistance even without a barrier metal layer when it is directly connected to a transparent pixel electrode, and excellent in resistance (corrosion resistance) against a chemical liquid (alkaline developer, remover) to be used in the manufacturing procedure of a display device. As a result, they have found a specific method based on the concept that an Al alloy film containing, as an essential component, a relatively small amount of Co and Ge can satisfy the above-described requirements. The reasons for selecting the above elements and specifying the contents thereof in the present invention will next be described in detail.

The Al alloy film of the present invention contains Co in an amount of 0.05 to 0.5 atomic percent (at. %). Co contained in such an amount makes it possible to reduce the contact resistance to a low level.

The mechanism of it can be presumed as follows. Described specifically, when Co, as an alloy component, is incorporated in an Al alloy film, a conductive Co-containing precipitate or Co-rich layer is formed easily on the interface between the Al alloy film and a transparent pixel electrode. It can prevent formation of an insulating layer made of an Al oxide on the interface and at the same time, reduce the contact resistance to a low level because a major part of the contact current passes through the Co-containing precipitate or Co-rich layer between the Al alloy film and the transparent pixel electrode (such as ITO).

To achieve a low contact resistance by using Co, the Co content should be adjusted to 0.05 atomic percent or more, preferably 0.1 atomic percent or more. Excessive Co contents however may lead to an increase in the contact resistance and at the same time, deterioration in corrosion resistance. The Co content is therefore adjusted to 0.5 atomic percent or less, preferably 0.4 atomic percent or less. When the Co content becomes markedly excessive, it tends to be impossible to sufficiently reduce the electrical resistivity of the Al alloy film by the heat treatment at low temperatures.

The present inventors have also found that in order to enhance, as corrosion resistance, resistance against a remover to be used for peeling off the photosensitive resin as well as resistance against an alkaline developer, incorporation of Ge together with Co is effective.

In addition, incorporation of Ge together with Co can reduce the contact resistance.

In order to realize improvement in corrosion resistance and low contact resistance by using Ge, the Ge content should be adjusted to 0.2 atomic percent or more, preferably 0.3 atomic percent or more. When Ge is added excessively, however, it is impossible to suppress the electrical resistance to a low level after heat treatment at a relatively low temperature. In addition, it may be rather a cause for increasing the contact resistance. The Ge content is therefore adjusted to 1.0 atomic percent or less, preferably 0.8 atomic percent or less.

Low contact resistance has conventionally been realized by adding Co in a large amount, but this excessive Co has deteriorated resistance against developer. In the invention, on the other hand, when both Co and Ge are added as described above, low contact resistance can be realized by the addition of even a small amount of Co. As a result, compared with the conventional Al alloy film, the Al alloy film of the invention can achieve both low contact resistance and excellent resistance against developer.

The above-described effects can be produced by adjusting the Co content and Ge content to fall within the above-described respective ranges and at the same time, causing the Co content and the Ge content in the Al alloy film to satisfy the following formula (1):

$$[Ge] \geq -0.25 \times [Co] + 0.2 \quad (1)$$

(in the formula (1), [Ge] represents the Ge content (atomic percent) in the Al alloy film and [Co] represents the Co content (atomic percent) in the Al alloy film).

It is preferred to adjust the Co content and Ge content to fall within the above-described respective ranges and at the same time, cause the Co content and the Ge content in the Al alloy film to satisfy the following formula (2) (more preferably the following formula (3)):

$$[Ge] \geq -0.25 \times [Co] + 0.25 \quad (2)$$

$$[Ge] \geq -0.25 \times [Co] + 0.3 \quad (3)$$

(in the formulas (2) and (3), [Ge] represents the Ge content (atomic percent) in the Al alloy film and [Co] represents the Co content (atomic percent) in the Al alloy film).

With regards to the composition of the Al alloy film, it contains Co and Ge, which are added in the specified amounts, respectively and satisfy the above formula (1), and Al and inevitable impurities as the remaining portion. The Al alloy film can further contain, in order to enhance the heat resistance thereof, at least one element selected from the group consisting of rare earth elements (preferably, Nd, Gd, La, Y, Ce, Pr, and Dy).

A silicon nitride film (protective film) is then deposited by CVD or the like on the substrate having an Al alloy film thereon. It is presumed that there occurs a difference in thermal expansion between the resulting silicon nitride film and the Al alloy film by the high-temperature heat applied to the Al alloy film, resulting in the formation of a hillock (hump-like projection). Addition of the above rare earth element can however suppress formation of a hillock. Moreover, addition of the rare earth element can improve the corrosion resistance further.

As described above, in order to ensure the heat resistance and at the same time, enhance the corrosion resistance further, it is preferred to add at least one element selected from the group consisting of rare earth elements (preferably, Nd, Gd, La, Y, Ce, Pr, Dy) in a total amount of 0.05 atomic percent, more preferably 0.1 atomic percent. When the content of the rare earth element becomes excessive, the electrical resistivity of the Al alloy film itself after heat treatment increases. The total content of the rare earth element is therefore set at 0.7 atomic percent or less (preferably 0.5 atomic percent, more preferably 0.3 atomic percent).

Incidentally, the term "group consisting of rare earth elements" means a group consisting of lanthanoid elements (15 elements in total from La, atomic number of 57 to Lu, atomic number 71 in the periodic table) and, in addition, Sc (scandium) and Y (yttrium).

The Al alloy film is preferably deposited by sputtering method using a sputtering target (which may hereinafter be called "target"). This method is employed because it can easily deposit a thin film superior in in-plane uniformity of components or film thickness to thin films obtained by using ion plating method, electron beam deposition method, or vacuum deposition method.

In order to obtain the Al alloy film by using the above sputtering method, it is preferred to use, as the target, an Al alloy sputtering target that contains Co in an amount of 0.05 to 0.5 atomic percent and Ge in an amount of 0.2 to 1.0 atomic percent (and, if necessary, at least one element selected from the group consisting of rare earth elements (preferably, Nd, Gd, La, Y, Ce, Pr, or Dy) in a total content of 0.05 to 0.7 atomic percent (preferably in a total content of 0.05 to 0.3 atomic percent)); has the Co content and the Ge content in the sputtering target satisfying the below-described formula (1) (preferably, the below-described formula (2), more preferably, the below-described formula (3)); has, as the remaining portion, Al and inevitable impurities; and has a composition similar to that of a desired Al alloy film. If such a sputtering target is used, an Al alloy film having a desired component-composition can be obtained without causing a change in composition.

$$[Ge]-0.25\times[Co]+0.2 \quad (1)$$

$$[Ge]-0.25\times[Co]+0.25 \quad (2)$$

$$[Ge]-0.25\times[Co]+0.3 \quad (3)$$

(in the formulas (1), (2), and (3), [Ge] represents the Ge content (atomic percent) in the sputtering target and [Co] represents the Co content (atomic percent) in the sputtering target).

As the shape of the target, targets processed into any shape (such as rectangular plate, circular plate, or doughnut plate) can be used, depending on the shape or structure of a sputtering apparatus.

Examples of the manufacturing method of the target include a method of obtaining it from an ingot composed of an Al-containing alloy by using a melting casting method, powder sintering method, or spray forming method; and a method of preparing a preform (an intermediate before obtaining a final densified product) composed of an Al-containing alloy and then, densifying the preform by using a densification unit.

The present invention embraces a display device characterized in that the Al alloy film is used for the thin-film transistor. In the display device according to one mode, the Al alloy film is used as a source electrode and/or a drain electrode and a signal line of the thin-film transistor and the drain electrode is directly connected to a transparent conductive film; and/or the Al alloy film is used as a gate electrode and a scanning line.

In the display device according to another mode, an Al alloy film having the same composition is used for the gate electrode and the scanning line, and the source electrode and/or drain electrode and the signal line.

The transparent pixel electrode of the present invention is preferably indium tin oxide (ITO) or indium zinc oxide (IZO).

Referring to some drawings, the preferred embodiments of the display device relating to the present invention will next be described. Description will be made with liquid-crystal display devices (for example, a liquid crystal display device illustrated in FIG. 1, which will be described specifically later) equipped with an amorphous silicon TFT substrate and a polysilicon TFT substrate, respectively, as typical examples. The present invention is however not limited to them.

First Embodiment

Figure 2:
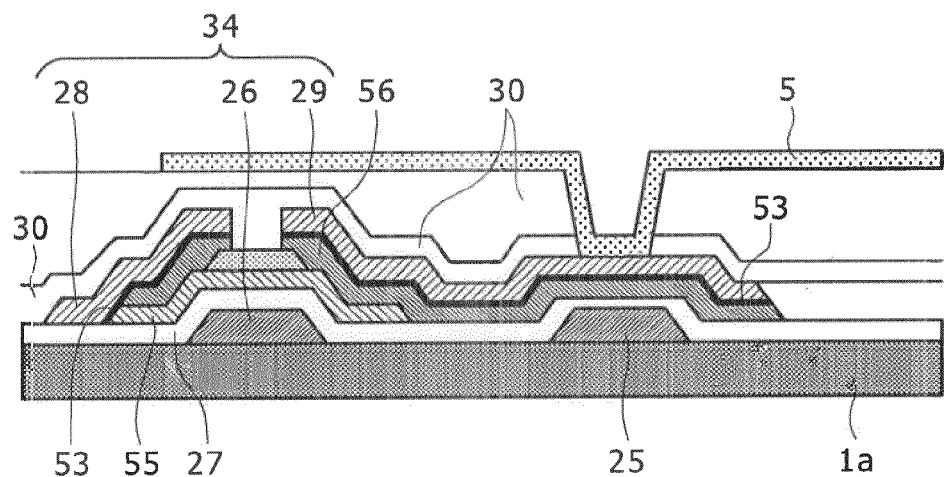
FIG. 2 is a schematic cross-sectional view illustrating the constitution of a TFT substrate according to a first embodiment of the present invention.
Figure 3:
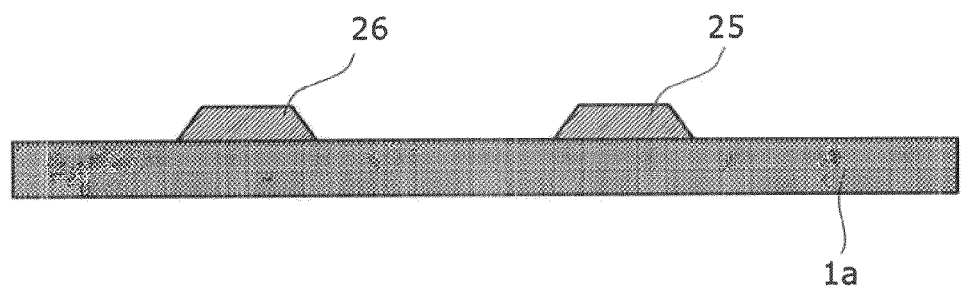
FIG. 3 is a schematic view sequentially illustrating an example of a manufacturing step of the TFT substrate illustrated in FIG. 2.

Referring to FIG. 2, the embodiment of an amorphous silicon TFT substrate will next be described specifically.

FIG. 2 is a fragmentary enlarged view of A in FIG. 1 (an example of the display device relating to the present invention) and is a schematic cross-sectional view for describing the preferred embodiment of a TFT substrate (bottom gate type) of the display device of the present invention.

In this embodiment, an Al alloy film is used as a source-drain electrode/single line (34) and a gate electrode/scanning line (25,26). A barrier metal layer is formed on each of a scanning line 25, a gate electrode 26, and a signal line 34 (source electrode 28 and drain electrode 29) in the conventional TFT substrate, while these barrier metal layers can be omitted from the TFT substrate of the present embodiment.

This means that in the present embodiment, the Al alloy film to be used as the drain electrode 29 of the TFT can be directly connected to the transparent pixel electrode 5 without placing the barrier metal layer therebetween. Even the TFT substrate according to such an embodiment can have TFT characteristics as good as those of the conventional TFT substrate.

Referring to FIGS. 3 to 10, an example of a manufacturing method of the amorphous silicon TFT substrate of FIG. 2 relating to the present invention will next be described. The thin-film transistor is an amorphous silicon TFT using, as a semiconductor layer thereof, hydrogenated amorphous silicon. In FIGS. 3 to 10, reference numerals similar to those used in FIG. 2 are given.

First, an Al alloy film of about 200 nm thick is stacked on a glass substrate (transparent substrate) 1a by using sputtering method. The deposition temperature upon sputtering is set at 150° C. The resulting Al alloy film is patterned to form a gate electrode 26 and a scanning line 25 (refer to FIG. 3). Upon formation of them, it is preferred to etch the periphery of each of the Al alloy films constituting the gate electrode 26 and the scanning line 25 to have a taper angle of about 30° to 40° in order to improve the coverage of the gate insulating film 27 in FIG. 4 which will be described below.

Figure 4:
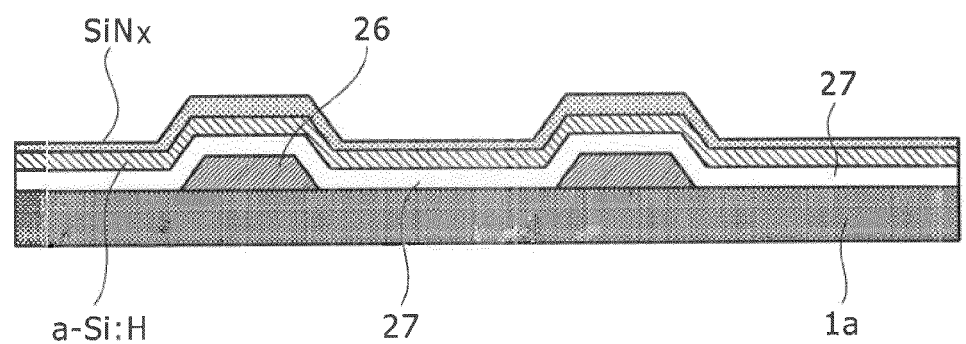
FIG. 4 is a schematic view sequentially illustrating an example of a manufacturing step of the TFT substrate illustrated in FIG. 2.

Then, as illustrated in FIG. 4, a silicon oxide film ($SiO_x$) of about 30 nm thick is deposited as the gate insulating film 27 by using, for example, plasma CVD method. Deposition temperature in the plasma CVD method is set at about 350° C. A hydrogenated amorphous silicon film (αSi—H) of about 50 nm thick and a silicon nitride film ($SiN_x$) of about 300 nm thick are then deposited on the gate insulating film 27 by using, for example, plasma CVD method.

Figure 5:
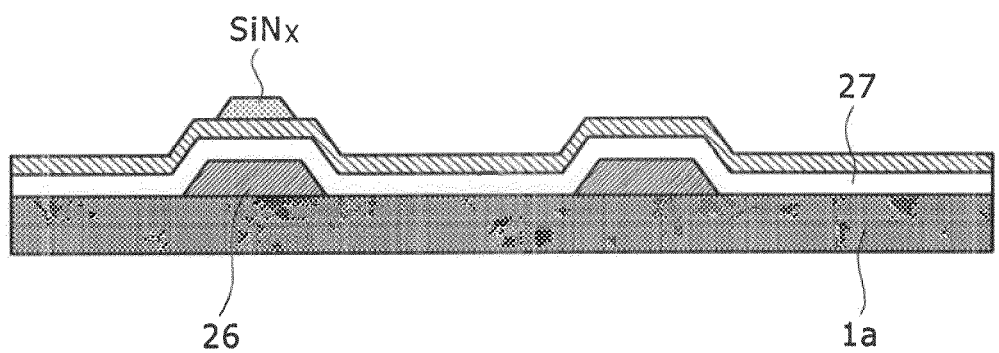
FIG. 5 is a schematic view sequentially illustrating an example of a manufacturing step of the TFT substrate illustrated in FIG. 2.
Figure 6:
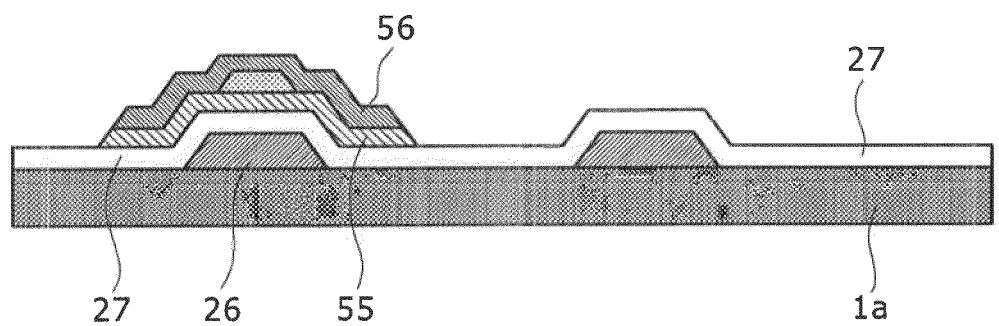
FIG. 6 is a schematic view sequentially illustrating an example of a manufacturing step of the TFT substrate illustrated in FIG. 2.

Then, by backside exposure with the gate electrode 26 as a mask, the silicon nitride film ($SiN_x$) is patterned as illustrated in FIG. 5 to form a channel protective film. After deposition of an $n^+$ type hydrogenated amorphous silicon film ($n^+$a-Si—H) 56 of about 50 nm thick doped with phosphorus on the channel protective film, the hydrogenated amorphous silicon film (aSi—H) 55 and the $n^+$ type hydrogenated amorphous silicon film ($n^+$a-Si—H) 56 are patterned as illustrated in FIG. 6.

Figure 7:
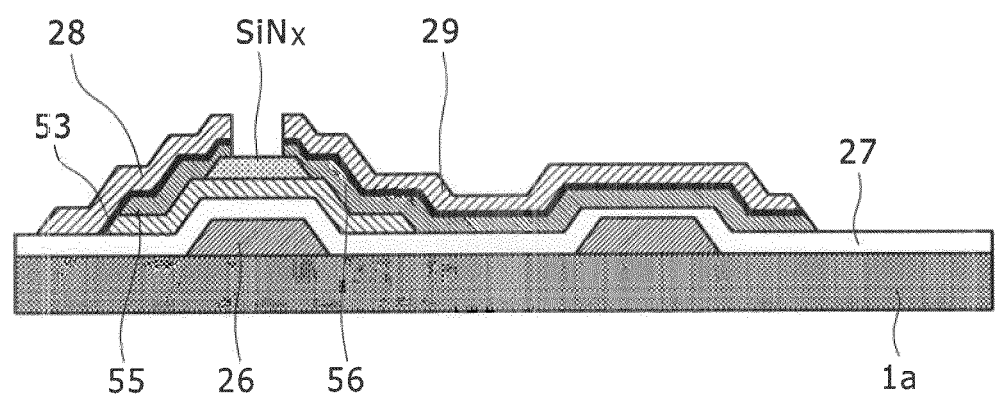
FIG. 7 is a schematic view sequentially illustrating an example of a manufacturing step of the TFT substrate illustrated in FIG. 2.

Then, a Mo film 53 of about 50 nm thick and Al alloy films 28,29 of about 300 nm thick are stacked successively on the patterned films by using sputtering method. The deposition temperature upon sputtering is set at 150° C. Then, patterning is performed as illustrated in FIG. 7 to form a source electrode 28 integrated with a signal line and a drain electrode 29 to be brought into direct contact with a transparent pixel electrode 5. Further, with the source electrode 28 and the drain electrode 29 as masks, the $n^+$ type hydrogenated amorphous silicon film ($n^+$a-Si—H) 56 on the channel protective film ($SiN_x$) is removed by dry etching.

Figure 8:
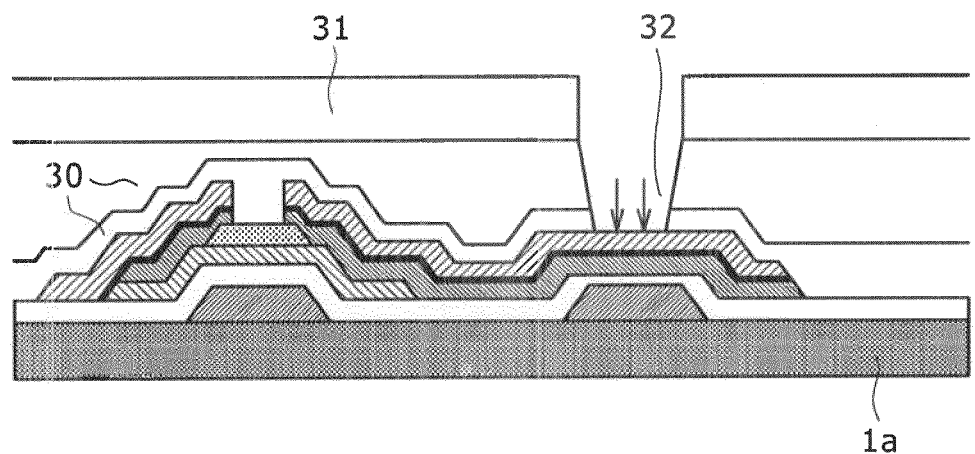
FIG. 8 is a schematic view sequentially illustrating an example of a manufacturing step of the TFT substrate illustrated in FIG. 2.

Then, as illustrated in FIG. 8, a silicon nitride film 30 of about 300 nm thick is deposited by using, for example, a plasma CVD apparatus to form a protective film. The deposition temperature at this time is, for example, about 250° C. After formation of a photoresist layer 31 on the silicon nitride film 30, the silicon nitride film 30 is patterned and a contact hole 32 is formed in the silicon nitride film 30, for example, by dry etching. At the same time, a contact hole (not illustrated) is formed at a portion to be connected to TAB on the gate electrode at the end portion of a panel.

Figure 9:
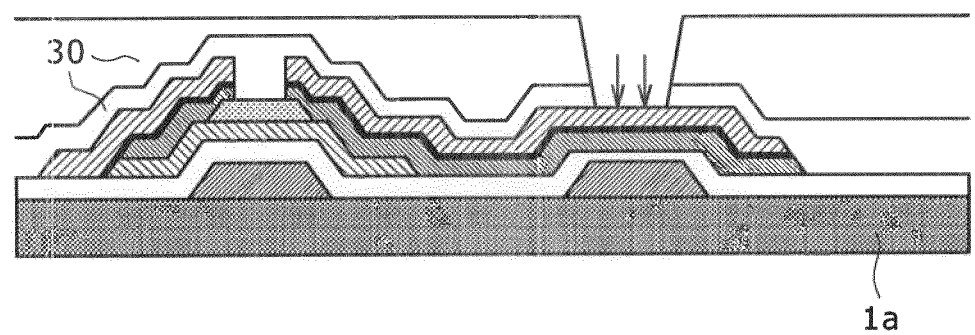
FIG. 9 is a schematic view sequentially illustrating an example of a manufacturing step of the TFT substrate illustrated in FIG. 2.
Figure 10:
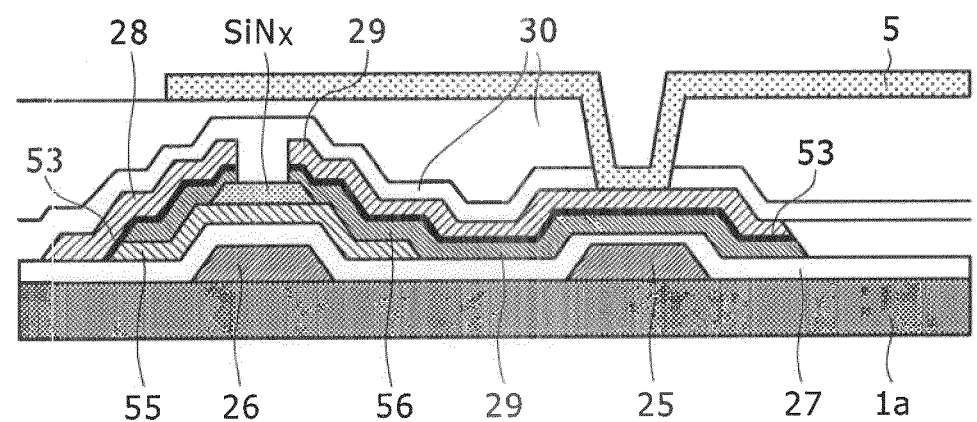
FIG. 10 is a schematic view sequentially illustrating an example of a manufacturing step of the TFT substrate illustrated in FIG. 2.

After an ashing step with, for example, oxygen plasma, the photoresist layer 31 is peeled by using a remover such as amine as illustrated in FIG. 9. Finally, an ITO film of, for example, about 40 nm is deposited as illustrated in FIG. 10 within a range of, for example, storage time (about 8 hours) and is then patterned by wet etching to form the transparent pixel electrode 5. At the same time, by patterning the ITO film in order to bond it to TAB at a connection portion with TAB on the gate electrode at the end portion of the panel, a TFT array substrate 1 is completed.

In the TFT substrate thus manufactured, the drain electrode 29 is directly connected with the transparent pixel electrode 5.

In the above example, an ITO film is used as the transparent pixel electrode 5, but it may be replaced by an IZO film. In addition, polysilicon may be used instead of amorphous silicon as an active semiconductor layer (refer to a second embodiment described later).

By using the TFT substrate thus obtained, the liquid crystal display device as illustrated in FIG. 1 is completed, for example, in the method described below.

First, for example, polyimide is applied to the surface of the TFT substrate 1 thus manufactured, followed by drying and rubbing treatments successively to form an alignment film.

On the other hand, a counter substrate 2 is manufactured by patterning, for example, chromium (Cr) in a matrix form on a glass substrate to form a light-shielding film 9, forming red, green, and blue color filters 8 made of a resin in the gaps of the light-shielding film 9, and then placing, as a common electrode 7, a transparent conductive film such as ITO film on the light-shielding film 9 and the color filters 8. After, for example, polyimide is applied to the uppermost layer of the counter electrode and dried, rubbing treatment is performed to form an alignment film 11.

Then, the TFT substrate 1 and the plane of the counter substrate 2 having the alignment film 11 thereon are placed so that they face each other and the TFT substrate 1 and the counter substrate 2 are laminated to each other except for a sealing port of liquid crystals with a sealing material 16 made of, for example, a resin. The gap between these two substrates is kept substantially constant, for example, by a spacer 15 inserted between the TFT substrate 1 and the counter substrate 2.

The empty cell thus obtained is placed in vacuum. A liquid cell material containing liquid crystal molecules is injected into the empty cell by gradually returning the pressure to atmospheric pressure while dipping the sealing port in the liquid crystals. After formation of a liquid crystal layer in such a manner, the sealing port is sealed. Finally, a polarizing plate 10 is laminated onto both outer sides of the empty cell to complete a liquid crystal display.

Then, as illustrated in FIG. 1, a driver circuit 13 for driving a liquid crystal display device is electrically connected to the liquid crystal display and is placed on the side portion or backside portion of the liquid crystal display. The liquid crystal display is supported with a support flame 23 including an opening to be a display surface of the liquid crystal display, a backlight 22 and a light guide plate 20 constituting a plane light source, and another support flame 23, whereby the liquid crystal display device is completed.

Second Embodiment

Figure 11:
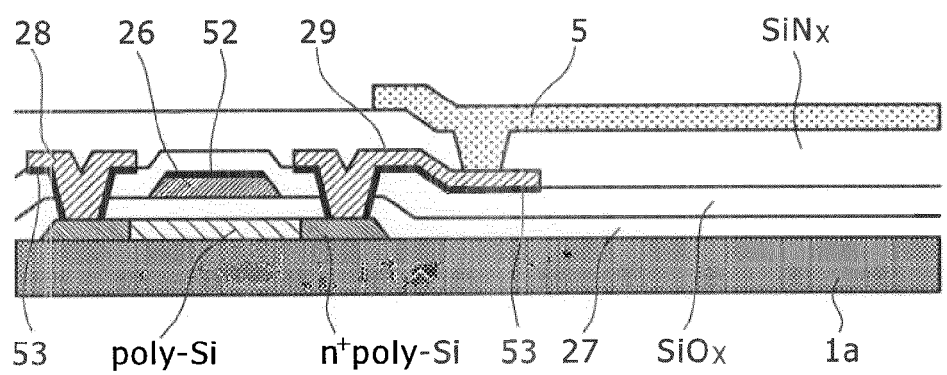
FIG. 11 is a schematic cross-sectional view illustrating the constitution of a TFT substrate according to a second embodiment of the present invention.

Referring to FIG. 11, an embodiment of a polysilicon TFT substrate will be described in detail.

FIG. 11 is a schematic cross-sectional view for describing a preferred embodiment of a top-gate TFT substrate relating to the present invention.

The present embodiment is different from the above first embodiment mainly in that as an active semiconductor layer, polysilicon is used instead of amorphous silicon, and a top-gate type TFT substrate is used instead of the bottom-gate type one. Described specifically, the active semiconductor film of the polysilicon TFT substrate of the present embodiment illustrated in FIG. 11 is made of a polysilicon film (poly-Si) not doped with phosphorus and a polysilicon film ($n^+$poly-Si) having phosphorus or arsenic ions implanted therein and in this sense, it is different from the amorphous silicon TFT substrate illustrated in FIG. 2. In addition, in the present embodiment, a signal line is formed so that it intersects with a scanning line via an interlayer insulating film ($SiO_x$).

Also in the present embodiment, a barrier metal layer, which is usually formed on a source electrode 28 and a drain electrode 28, can be omitted.

Referring to FIGS. 12 to 18, an example of a manufacturing method of the polysilicon TFT substrate of the present embodiment illustrated in FIG. 11 will next be described. The thin-film transistor is a polysilicon TFT using a polysilicon film (poly-Si) as a semiconductor layer. In FIGS. 12 to 18, reference numerals similar to those used in FIG. 11 are given.

A silicon nitride film ($SiN_x$) of about 50 nm thick, a silicon oxide film ($SiO_x$) of about 100 nm thick, and a hydrogenated amorphous silicon film (a-Si—H) of about 50 nm thick are deposited on a glass substrate 1a at a substrate temperature of about 300° C. by using, for example, plasma CVD method.

Figure 12:
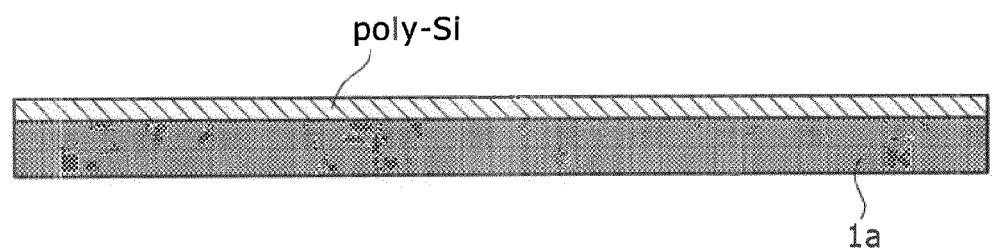
FIG. 12 is a schematic view sequentially illustrating an example of a manufacturing step of the TFT substrate illustrated in FIG. 11.

The resulting films are subjected to heat treatment (for about one hour at about 470° C.) and laser annealing to convert the hydrogenated amorphous silicon film (a-Si—H) into polysilicon. After dehydrogenation treatment, the hydrogenated amorphous silicon film (a-Si—H) is exposed to laser at an energy of about 230 mJ/cm² by using, for example, an excimer laser annealer to obtain a polysilicon film (poly-Si) of about 0.3 μm thick (FIG. 12).

Figure 13:
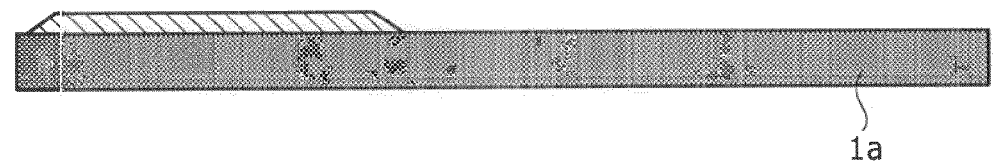
FIG. 13 is a schematic view sequentially illustrating an example of a manufacturing step of the TFT substrate illustrated in FIG. 11.
Figure 14:
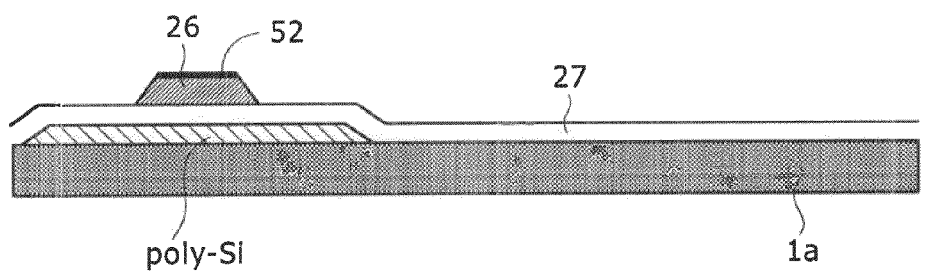
FIG. 14 is a schematic view sequentially illustrating an example of a manufacturing step of the TFT substrate illustrated in FIG. 11.

As illustrated in FIG. 13, the polysilicon film (poly-Si) is then patterned by using plasma etching or the like. As illustrated in FIG. 14, a silicon oxide film ($SiO_x$) of about 100 nm thick is then formed as a gate insulating film 27. After stacking an Al alloy film of about 200 nm thick and a barrier metal layer (Mo thin film) 52 of about 50 nm on the gate insulating film 27 by using sputtering or the like, they are patterned by using plasma etching or the like. As a result, a gate electrode 26 integrated with a scanning line is formed.

Figure 15:
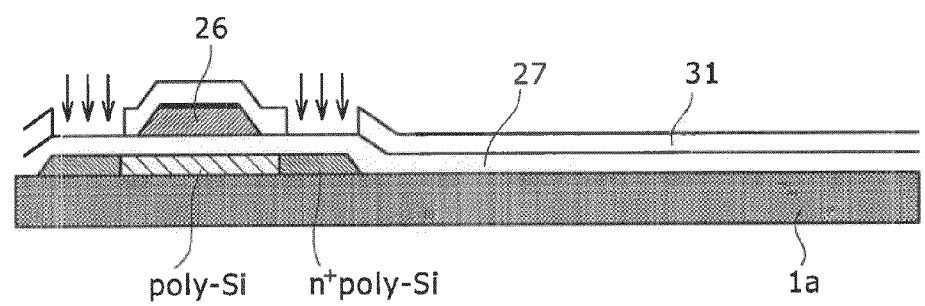
FIG. 15 is a schematic view sequentially illustrating an example of a manufacturing step of the TFT substrate illustrated in FIG. 11.

As illustrated in FIG. 15, through a mask formed of a photoresist 31, doping is then performed with, for example, phosphorus at about 50 keV and a dose of about $1 \times 10^{15}/cm^2$ to form a n⁺ type polysilicon film (n⁺poly-Si) in a portion of the polysilicon film (poly-Si). The photoresist 31 is peeled off and phosphorus is diffused by heat treatment at, for example, about 500° C.

Figure 16:
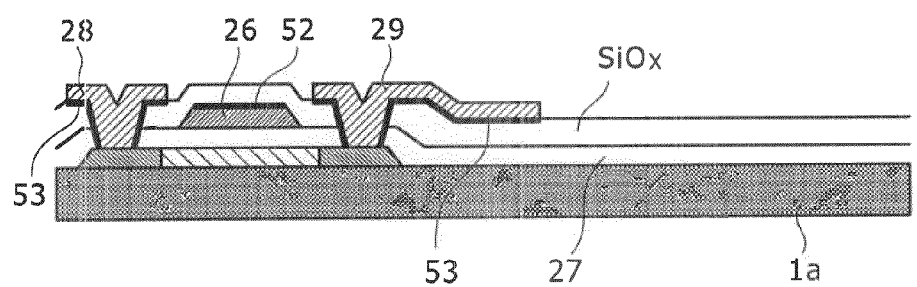
FIG. 16 is a schematic view sequentially illustrating an example of a manufacturing step of the TFT substrate illustrated in FIG. 11.

As illustrated in FIG. 16, a silicon oxide film ($SiO_x$) of about 500 nm thick is then deposited as an interlayer insulating film at a substrate temperature of about 250° C. by using, for example, a plasma CVD apparatus. The interlayer insulating film ($SiO_x$) and the silicon oxide film as the gate insulating film 27 are dry etched by using a patterned photoresist as a mask to form contact holes. Sputtering is then performed to deposit a Mo film 53 of about 50 nm thick and an Al alloy film of about 450 nm thick, followed by patterning to form a source electrode 28 and a drain electrode 29 integrated with a signal line. As a result, the source electrode 28 and the drain electrode 29 are brought into contact with the n⁺ polysilicon film (n⁺poly-Si) via each of the contact holes.

Figure 17:
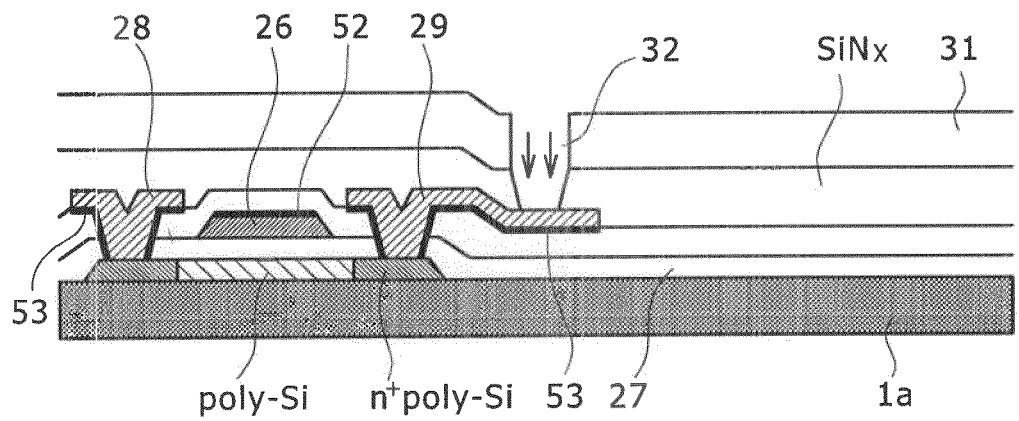
FIG. 17 is a schematic view sequentially illustrating an example of a manufacturing step of the TFT substrate illustrated in FIG. 11.

As illustrated in FIG. 17, a silicon nitride film ($SiN_x$) of about 500 nm thick is deposited at a substrate temperature of about 250° C. by using a plasma CVD apparatus or the like to form an interlayer insulating film. After formation of a photoresist layer 31 on the interlayer insulating film, the silicon nitride film ($SiN_x$) is patterned and a contact hole 32 is formed in the silicon nitride film ($SiN_x$) by using, for example, dry etching.

Figure 18:
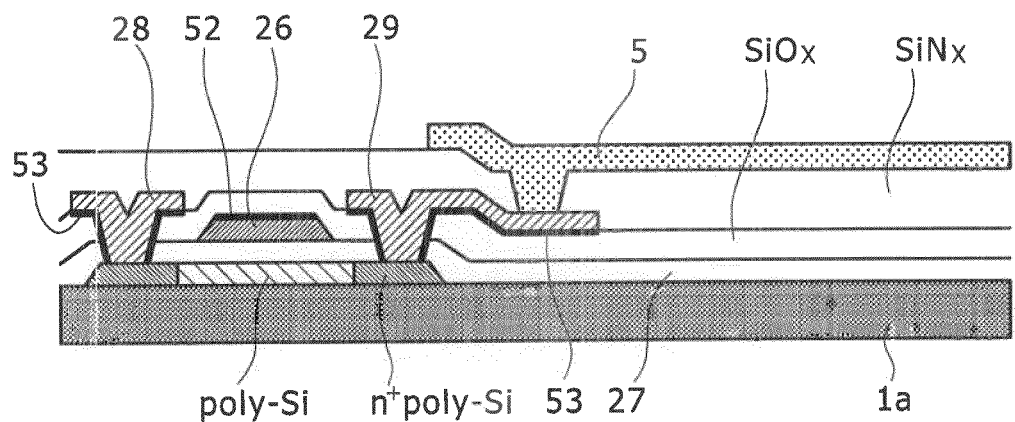
FIG. 18 is a schematic view sequentially illustrating an example of a manufacturing step of the TFT substrate illustrated in FIG. 11.

As illustrated in FIG. 18, after an ashing step with, for example, oxygen plasma, the photoresist is then peeled off with an amine remover in a manner similar to that employed in the first embodiment. An ITO film is deposited and is then patterned by wet etching to form a transparent pixel electrode 5.

In the polysilicon TFT substrate thus manufactured, the drain electrode 29 is directly connected with the transparent pixel electrode 5.

Annealing is performed, for example, at about 250° C. for about one hour in order to stabilize the characteristics of the transistor. As a result, manufacture of a polysilicon TFT array substrate is completed.

Advantages similar to those obtained from the TFT substrate of the first embodiment can be obtained from the TFT substrate of the second embodiment and a liquid crystal display device equipped with the TFT substrate.

By using the TFT array substrate thus obtained in a manner similar to that employed for the TFT substrate of the first embodiment, a liquid crystal display device as illustrated in FIG. 1 is completed.

EXAMPLES

The present invention will hereinafter be described more specifically by Examples. It should however be borne in mind that the present invention is not limited by the following examples; variations may of course be made as needed without departing from the spirit described above or later; and any variations may be embraced in the technical scope of the present invention.

Al alloy films (film thickness=300 nm) having various alloy compositions as shown in Tables 1 and 2 were deposited by using a DC magnetron sputtering method (substrate: glass substrate ("Eagle 2000", product of Corning Incorporated), atmospheric gas: argon, pressure: 2 mTorr, substrate temperature: 25° C. (room temperature)).

For the deposition of Al alloy films having the various alloy compositions, Al alloy targets having various compositions and prepared by using a vacuum melting method were used as a sputtering target.

The content of each alloy element in the various Al alloy films used in Examples was determined by using ICP spectroscopy (inductively coupled plasma spectroscopy).

By using the Al alloy films thus obtained, electrical resistivity of the Al alloy film itself after heat treatment, direct contact resistance (contact resistance with ITO) when the Al alloy film was directly connected to a transparent pixel electrode, heat resistance, and resistance against alkaline developer and resistance against remover as corrosion resistance were measured by using the methods described below. The results are also shown in Tables 1 and 2.

(1) Electrical Resistivity of Al Alloy Film Itself After Heat Treatment

Line and space patterns of 10 μm wide were formed on each of the Al alloy films. After heat treatment at 270° C. for 15 minutes in an inert gas atmosphere, the electrical resistivity of the film was measured by using the four-terminal method. Whether the electrical resistivity of the Al alloy film itself after heat treatment was good or bad was determined based on the following criteria.

Figure 19:
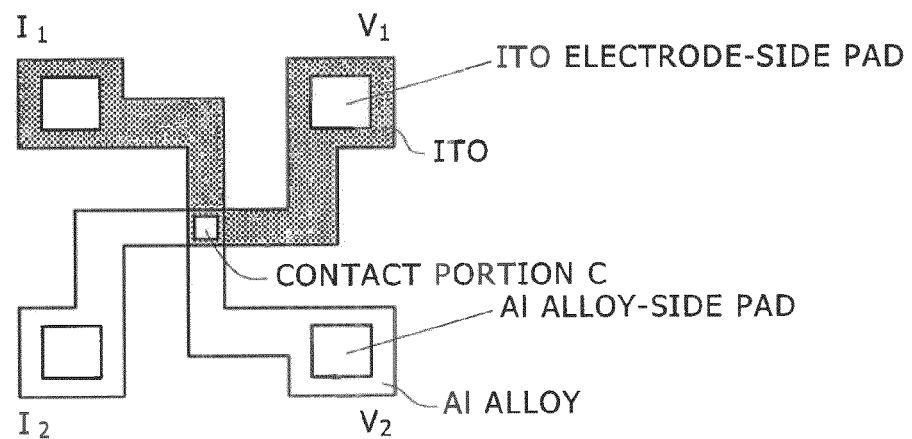
FIG. 19 illustrates a Kelvin pattern (TEG pattern) used for the measurement of direct contact resistance between an Al alloy film and a transparent pixel electrode.

(Criteria)
 A: less than 4.6 μΩ·cm
 B: 4.6 μΩ·cm or more (2) Direct Contact Resistance with Transparent Pixel Electrode The contact electrical resistance when the Al alloy film was brought into contact with the transparent pixel electrode was determined by sputtering a transparent pixel electrode (ITO: indium tin oxide obtained by adding 10 mass % of tin oxide to indium oxide) under the conditions described below to form a Kelvin pattern (contact hole size: 10 μm square) as illustrated in FIG. 19 and carrying out the four-terminal measurement (method of causing an electric current to flow through an ITO-Al alloy film and measuring a voltage drop between ITO and Al alloy by using another terminal). More specifically, an electric current I was caused to flow between $I_1$ to $I_2$ of FIG. 19 and a voltage V between $V_1$–$V_2$ is monitored to determine a direct contact resistance R at the contact portion C as [$R=(V_2-V_1)/I_2$]. Whether the direct contact resistance with ITO was good or bad was determined based on the following criteria.

(Deposition Condition of Transparent Pixel Electrode)
 Atmospheric gas: argon
 Pressure: 0.8 mTorr
 Substrate temperature: 25° C. (room temperature)
(Criteria)
 A: less than 1000Ω
 B: 1000Ω or more (3) Resistance Against Alkaline Developer (Measurement of Etching Rate of Developer)

The Al alloy film formed on a substrate was masked and then dipped in a developer (aqueous solution containing 2.38 mass % of TMAH) for one minute at 25° C. The etched amount of the film was measured using a stylus profiler. Whether the resistance against alkaline developer was good or bad was determined based on the following criteria.
(Criteria)
A: less than 60 nm/min.
B: 60 nm/min or more but not more than 100 nm/min.
C: exceeding 100 nm/min.

(4) Resistance Against Remover

A corrosion test using an aqueous alkali solution obtained by mixing an amine photoresist with water was performed by using a simulated washing step with a photoresist remover. Described specifically, an aqueous solution of an amine resist remover "TOK106" manufactured by TOKYO OHKA KOGYO and adjusted to pH 10 (liquid temperature: 25° C.) was prepared and the Al alloy film heat treated for 30 minutes at 330° C. in an inert gas atmosphere was dipped for 300 seconds. The number of crater-like corrosion (pitting corrosion) marks (marks corresponding to a circle having a diameter of 150 nm or more) observed on the surface of the film after dipping was studied (observation magnification: 1000×). Whether the resistance against the remover was good or bad was determined based on the following criteria.
(Criteria)
A: less than 10 pieces/100 μm$^2$
B: 10 pieces/100 μm$^2$ or more but not more than 20 pieces/100 μm$^2$
C: exceeding 20 pieces/100 μm$^2$ (5) Heat Resistance After heat treatment of the Al alloy film, which had been deposited on the substrate, at 350° C. for 30 minutes in a nitrogen atmosphere, the surface properties were observed by using an optical microscope (magnification: 500×) and presence or absence of hillocks was visually observed. The heat resistance was evaluated based on the following criteria.
(Criteria)
A: The surface has neither hillocks nor roughening.
B: The surface has no hillocks but surface roughening.
C: The surface has hillocks.

TABLE 1

| No. | Composition* | Content in Al alloy film Co (atomic %) | Content in Al alloy film Ge (atomic %) | −0.25 × Co + 0.2 (atomic %) | Electrical resistivity (μΩ · cm) after heat treatment at 270° C. | | Crater-like corrosion density (piece/ 100 μm$^2$) | | Developer etching rate (nm/min.) | | Contact resistance (Ω) with ITO | | Heat resistance (350° C.) |
|---|---|---|---|---|---|---|---|---|---|---|---|---|---|
| 1 | Al—0.05Co—0.2Ge—0.2La | 0.05 | 0.2 | 0.19 | 3.7 | A | 0.1 | A | 19 | A | 1348 | B | A |
| 2 | Al—0.1Co—0.2Ge—0.2La | 0.1 | 0.2 | 0.18 | 3.7 | A | 0.2 | A | 20 | A | 254 | A | A |
| 3 | Al—0.1Co—0.5Ge—0.2Nd | 0.1 | 0.5 | 0.18 | 3.7 | A | 0.2 | A | 22 | A | 231 | A | A |
| 4 | Al—0.1Co—0.8Ge—0.2La | 0.1 | 0.8 | 0.18 | 4.0 | A | 0.3 | A | 25 | A | 216 | A | A |
| 5 | Al—0.1Co—1.0Ge—0.2Gd | 0.1 | 1.0 | 0.18 | 4.2 | A | 1.2 | A | 28 | A | 197 | A | A |
| 6 | Al—0.1Co—0.2Ge—0.5Nd | 0.1 | 0.2 | 0.18 | 4.1 | A | 0.1 | A | 20 | A | 581 | A | A |
| 7 | Al—0.1Co—0.5Ge—0.5La | 0.1 | 0.5 | 0.18 | 4.2 | A | 0.1 | A | 21 | A | 546 | A | A |
| 8 | Al—0.1Co—0.8Ge—0.5Nd | 0.1 | 0.8 | 0.18 | 4.4 | A | 0.2 | A | 23 | A | 513 | A | A |
| 9 | Al—0.1Co—1.0Ge—0.5La | 0.1 | 1.0 | 0.18 | 4.5 | A | 0.8 | A | 24 | A | 484 | A | A |
| 10 | Al—0.2Co—0.2Ge—0.1La | 0.2 | 0.2 | 0.15 | 3.7 | A | 0.3 | A | 19 | A | 142 | A | A |
| 11 | Al—0.2Co—0.5Ge—0.1La | 0.2 | 0.5 | 0.15 | 3.8 | A | 0.4 | A | 25 | A | 139 | A | A |
| 12 | Al—0.2Co—0.8Ge—0.1La | 0.2 | 0.8 | 0.15 | 4.1 | A | 0.4 | A | 32 | A | 137 | A | A |
| 13 | Al—0.2Co—1.0Ge—0.1La | 0.2 | 1.0 | 0.15 | 4.3 | A | 2.1 | A | 30 | A | 137 | A | A |
| 14 | Al—0.5Co—0.2Ge—0.2La | 0.5 | 0.2 | 0.08 | 3.9 | A | 4.7 | A | 63 | B | 122 | A | A |
| 15 | Al—0.5Co—0.5Ge—0.2La | 0.5 | 0.5 | 0.08 | 4.0 | A | 6.5 | A | 65 | B | 132 | A | A |
| 16 | Al—0.5Co—0.8Ge—0.2La | 0.5 | 0.8 | 0.08 | 4.1 | A | 3.4 | A | 70 | B | 131 | A | A |
| 17 | Al—0.5Co—1.0Ge—0.2La | 0.5 | 1.0 | 0.08 | 4.3 | A | 6.3 | A | 71 | B | 157 | A | A |
| 18 | Al—0.2Co—0.2Ge—0.3La | 0.2 | 0.2 | 0.15 | 4.1 | A | 3.2 | A | 24 | A | 854 | A | A |
| 19 | Al—0.5Co—0.2Ge—0.3La | 0.5 | 0.2 | 0.08 | 4.1 | A | 3.6 | A | 80 | B | 494 | A | A |
| 20 | Al—0.5Co—0.3Ge—0.3La | 0.5 | 0.3 | 0.08 | 3.9 | A | 6.6 | A | 91 | B | 836 | A | A |
| 21 | Al—0.5Co—0.5Ge—0.3La | 0.5 | 0.5 | 0.08 | 3.8 | A | 5.0 | A | 72 | B | 962 | A | A |
| 22 | Al—0.2Co—0.5Ge—0.1Gd | 0.2 | 0.5 | 0.15 | 4.1 | A | 0.4 | A | 27 | A | 139 | A | A |
| 23 | Al—0.2Co—0.5Ge—0.1Nd | 0.2 | 0.5 | 0.15 | 3.7 | A | 0.5 | A | 29 | A | 137 | A | A |

*The numerical value represents atomic % in an Al alloy film.

TABLE 2

| No. | Composition * | Content in Al alloy film Co (atomic %) | Content in Al alloy film Ge (atomic %) | −0.25 × Co + 0.2 (atomic %) | Electrical resistivity (μΩ · cm) after heat treatment at 270° C. | | Crater-like corrosion density (piece/ 100 μm$^2$) | | Developer etching rate (nm/min.) | | Contact resistance (Ω) with ITO | | Heat resistance (350° C.) |
|---|---|---|---|---|---|---|---|---|---|---|---|---|---|
| 24 | Al—0.7Co—0.2Ge—0.3Nd | 0.7 | 0.2 | 0.03 | 4.2 | A | 48.4 | C | 126 | C | 114 | A | A |
| 25 | Al—0.7Co—1.2Ge—0.3Gd | 0.7 | 1.2 | 0.03 | 4.4 | A | 49.0 | C | 124 | C | 119 | A | A |
| 26 | Al—0.8Co—0.5Ge—0.4Nd | 0.8 | 0.5 | 0.00 | 4.4 | A | 51.1 | C | 136 | C | 107 | A | A |

TABLE 2-continued

| No. | Composition* | Content in Al alloy film Co (atomic %) | Content in Al alloy film Ge (atomic %) | −0.25 × Co + 0.2 (atomic %) | Electrical resistivity (μΩ·cm) after heat treatment at 270° C. | | Crater-like corrosion density (piece/ 100 μm$^2$) | | Developer etching rate (nm/min.) | | Contact resistance (Ω) with ITO | | Heat resistance (350° C.) |
|---|---|---|---|---|---|---|---|---|---|---|---|---|---|
| 27 | Al—0.9Co—0.5Ge—0.3La | 0.9 | 0.5 | −0.03 | 4.4 | A | 64.0 | C | 157 | C | 94 | A | A |
| 28 | Al—1.0Co—0.3Ge—0.3La | 1.0 | 0.3 | −0.05 | 4.6 | B | 68.4 | C | 164 | C | 83 | A | A |
| 29 | Al—0.3Ge—0.2La | 0 | 0.3 | 0.20 | 3.8 | A | 0.2 | A | 20 | A | 143145 | B | B |
| 30 | Al—0.5Co—0.2La | 0.5 | 0 | 0.08 | 3.7 | A | 24.1 | C | 134 | C | 5143 | B | B |
| 31 | Al—0.5Co—0.2Ge | 0.5 | 0.2 | 0.08 | 3.6 | A | 15.0 | B | 60 | B | 140 | A | B |
| 32 | Al—0.2Co—2.0Ge—0.1La | 0.2 | 2.0 | 0.15 | 4.8 | B | 8.0 | A | 42 | A | 1066 | B | A |
| 33 | Al—0.5Co—0.3La | 0.5 | 0 | 0.08 | 3.8 | A | 23.0 | C | 122 | C | 5363 | B | A |
| 34 | Al—0.5Co—0.5Ag—0.3La | 0.5 | 0 | 0.08 | 3.9 | A | 46.0 | C | 130 | C | 302000 | B | A |
| 35 | Al—0.5Co—0.5B—0.3La | 0.5 | 0 | 0.08 | 3.9 | A | 36.0 | C | 111 | C | 25630 | B | A |
| 36 | Al—0.5Ag—0.5Ge—0.3La | 0 | 0.5 | 0.20 | 4.0 | A | 45.0 | C | 110 | C | 850 | A | A |
| 37 | Al—0.5Co—0.5Ge—0.3Y | 0.5 | 0.5 | 0.08 | 4.3 | A | 1.0 | A | 46 | A | 515 | A | A |
| 38 | Al—0.5Co—0.5Ge—0.3Ce | 0.5 | 0.5 | 0.08 | 4.4 | A | 2.3 | A | 42 | A | 694 | A | A |
| 39 | Al—0.5Co—0.5Ge—0.3Pr | 0.5 | 0.5 | 0.08 | 4.5 | A | 4.0 | A | 42 | A | 774 | A | A |
| 40 | Al—0.5Co—0.5Ge—0.3Dy | 0.5 | 0.5 | 0.08 | 4.5 | A | 4.5 | A | 40 | A | 865 | A | A |

*The numerical value represents atomic % in an Al alloy film.

It has been found from the results of Tables 1 and 2 that Al alloy films containing specified amounts of Co and Ge can exhibit a sufficiently reduced electrical resistivity even after heat treatment at low temperatures and at the same time, can have a drastically reduced direct contact resistance with ITO (transparent pixel electrode), that is, a low contact resistance. It has also been found that they are excellent in, as corrosion resistance, both resistance against alkaline developer and resistance against remover.

It has been found further that the above Al alloy films can ensure excellent heat resistance when containing a rare earth element further.

On the contrary, Al alloy films having a Co content exceeding the upper limit cannot have a low contact resistance or become inferior in corrosion resistance (resistance against alkaline developer, resistance against remover).

Al alloy films containing no Co but containing Ag instead become inferior in corrosion resistance (resistance against alkaline developer, resistance against remover).

Al alloy films having an excessive Ge content cannot show a sufficiently reduced electrical resistivity after heat treatment at low temperatures. On the other hand, those not containing Ge cannot have a sufficiently reduced contact resistance and at the same time are inferior in corrosion resistance (resistance against alkaline developer, resistance against remover).

Figure 20:
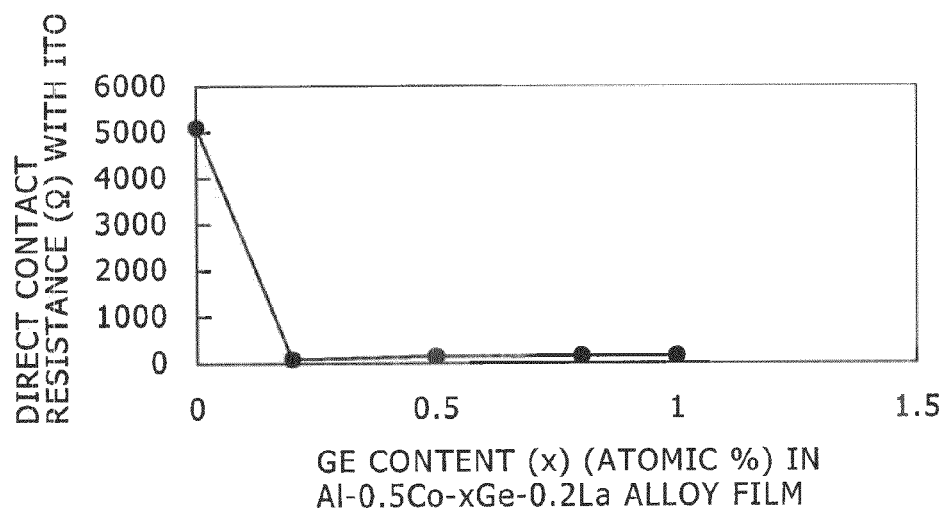
FIG. 20 is a graph showing the relationship between a Ge content (x) in an Al–(0.5 at. % Co)–(x at. % Ge)–(0.2 at. % La) alloy film and a direct contact resistance with ITO.

FIG. 20 is a graph showing the relationship between Ge content (x) in an Al—(0.5 at. % Co)—(x at. % Ge)—(0.2 at. % La) alloy film and direct contact resistance with ITO based on the results of the above examples. It has been found from FIG. 20 that the above Al alloy films containing 0.2 atomic percent or more of Ge can have a sufficiently reduced direct contact resistance.

The present invention was described in detail or described referring to certain embodiments but it is apparent for those skilled in the art that various variations or modifications can be added without departing from the spirit and scope of the present invention.

The present application is based on Japanese Patent Application (Japanese Patent Application No. 2008-112912) filed on Apr. 23, 2008, the contents of which are incorporated herein for reference.

INDUSTRIAL APPLICABILITY

The present invention makes it possible to provide an Al alloy film for display device capable of being directly connected to a transparent pixel electrode (transparent conductive film, oxide conductive film) without placing a barrier metal layer therebetween; capable of exhibiting a sufficiently low electrical resistivity even when a relatively low heat treatment temperature (for example, from about 250 to 300° C.) is applied; excellent in corrosion resistance (resistance against alkaline developer, resistance against remover); and moreover, capable of ensuring heat resistance. Incidentally, the term "heat treatment temperature" means a treatment temperature that becomes the highest in the manufacturing steps (for example, a manufacturing step of a TFT substrate) of a display device. It means, in the manufacturing steps of conventional display devices, a heating temperature of a substrate upon CVD for depositing various thin films or a temperature of a heat treating furnace upon thermosetting a protective film.

When the Al alloy film of the present invention is used for a display device, the barrier metal layer can be omitted therefrom. Accordingly, a highly-productive, low-cost, and high-performance display device can be obtained using the Al alloy film of the present invention.

[Description of Reference Numerals]

| | |
|---|---|
| 1. | TFT substrate |
| 2. | Counter substrate |
| 3. | Liquid crystal layer |
| 4. | Thin-film transistor (TFT) |
| 5. | Transparent pixel electrode (transparent conductive film) |
| 6. | Wiring portion |
| 7. | Common electrode |
| 8. | Color filter |
| 9. | Light-shielding film |
| 10. | Polarizing plate |
| 11. | Alignment film |
| 12. | TAB tape |
| 13. | Driver circuit |
| 14. | Control circuit |
| 15. | Spacer |
| 16. | Sealing material |
| 17. | Protective film |
| 18. | Diffusion plate |
| 19. | Prism sheet |
| 20. | Light guide plate |
| 21. | Reflector |
| 22. | Backlight |

-continued

[Description of Reference Numerals]

| | |
|---|---|
| 23. | Support flame |
| 24. | Printed board |
| 25. | Scanning line |
| 26. | Gate electrode |
| 27. | Gate insulating film |
| 28. | Source electrode |
| 29. | Drain electrode |
| 30. | Protective film (silicon nitride film) |
| 31. | Photoresist |
| 32. | Contact hole |
| 33. | Amorphous silicon channel film (active semiconductor film) |
| 34. | Signal line |
| 52, 53. | Barrier metal layer |
| 55. | Non-doped hydrogenated amorphous silicon film (a-Si—H) |
| 56. | $n^+$ Type hydrogenated amorphous silicon film ($n^+$a-Si—H) |

The invention claimed is:

1. An Al alloy film comprising:
(a) Co in an amount of from 0.05 to 0.5 atomic percent;
(b) Ge in an amount of from 0.2 to 1.0 atomic percent; and
(c) at least one element selected from the group consisting of rare earth elements in a total content of 0.05 to 0.7 atomic percent;
wherein
the Co content and the Ge content in the Al alloy film satisfy the following formula (1):

$$[Ge] \geq -0.25 \times [Co] + 0.2 \tag{1}$$

wherein, in the formula (1), [Ge] represents the Ge content, in atomic percent, in the Al alloy film and [Co] represents the Co content, in atomic percent in the Al alloy film.

2. The Al alloy film according to claim 1, further comprising at least one element selected from the group consisting of rare earth elements in a total content of 0.05 to 0.3 atomic percent.

3. The Al alloy film according to claim 1, wherein the group of rare earth elements consists of Nd, Gd, La, Y, Ce, Pr, and Dy.

4. The Al alloy film according to claim 3, wherein the total amount of at least one rare earth element is 0.05 to 0.5 atomic percent.

5. The Al alloy film according to claim 3, wherein the total amount of at least one rare earth element is 0.05 to 0.3 atomic percent.

6. A display device equipped with a thing-film transistor comprising the Al alloy film as claimed in claim 1.

7. The display device according to claim 6, wherein the Al alloy film is directly connected to a transparent conductive film on a substrate of the display device.

8. The Al alloy film according to claim 1, wherein the amount of Co is from 0.1 to 0.4 atomic percent.

9. The Al alloy film according to claim 1, wherein the amount of Ge is from 0.3 to 0.8 atomic percent.

10. A sputtering target comprising:
(a) Co in an amount of from 0.05 to 0.5 atomic percent;
(b) Ge in an amount of from 0.2 to 1.0 atomic percent;
(c) at least one element selected from the group consisting of rare earth elements in a total content of 0.05 to 0.7 atomic percent;
wherein the Co content and the Ge content satisfy the following formula (1):

$$[Ge] \geq -0.25 \times [Co] + 0.2 \tag{1}$$

wherein, in the formula (1), [Ge] represents the Ge content, in atomic percent, in the sputtering target and [Co] represents the Co content, in atomic percent, in the sputtering target; and further comprising, as a remaining portion, Al and an inevitable impurity.

11. The sputtering target according to claim 10, further comprising at least one element selected from the group consisting of rare earth elements in a total content of 0.05 to 0.3 atomic percent.

12. The sputtering target according to claim 10, wherein the group of rare earth elements consists of Nd, Gd, La, Y, Ce, PR, and Dy.

13. The sputtering target according to claim 12, wherein the total amount of at least one rare earth element is 0.05 to 0.5 atomic percent.

14. The sputtering target according to claim 12, wherein the total amount of at least one rare earth element is 0.05 to 0.3 atomic percent.

15. The sputtering target according to claim 10, wherein the amount of Co is from 0.1 to 0.4 atomic percent.

16. The sputtering target according to claim 10, wherein the amount of Ge is from 0.3 to 0.8 atomic percent.

* * * * *